United States Patent
Liao et al.

(10) Patent No.: US 10,658,199 B2
(45) Date of Patent: May 19, 2020

(54) SEMICONDUCTOR DEVICE AND METHOD

(71) Applicant: Taiwan Semiconductor Manufacturing Company, Ltd., Hsin-Chu (TW)

(72) Inventors: Sih-Hao Liao, New Taipei (TW); Yu-Hsiang Hu, Hsin-Chu (TW); Hung-Jui Kuo, Hsin-Chu (TW); Chen-Hua Yu, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/368,192

(22) Filed: Dec. 2, 2016

(65) Prior Publication Data

US 2018/0061669 A1 Mar. 1, 2018

Related U.S. Application Data

(60) Provisional application No. 62/378,564, filed on Aug. 23, 2016.

(51) Int. Cl.
| | |
|---|---|
| *H01L 21/48* | (2006.01) |
| *C08G 73/10* | (2006.01) |
| *C09D 179/08* | (2006.01) |
| *H01L 21/56* | (2006.01) |
| *H01L 23/538* | (2006.01) |

(52) U.S. Cl.
CPC ...... *H01L 21/4857* (2013.01); *C08G 73/1025* (2013.01); *C09D 179/08* (2013.01); *H01L 21/563* (2013.01); *C08G 2190/00* (2013.01); *H01L 23/5389* (2013.01); *H01L 2224/04105* (2013.01); *H01L 2224/12105* (2013.01); *H01L 2224/18* (2013.01); *H01L 2224/48091* (2013.01); *H01L 2224/73265* (2013.01); *H01L 2224/73267* (2013.01); *H01L 2924/15311* (2013.01); *H01L 2924/181* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,582,564 B2* | 9/2009 | Wang | ....... | B23H 5/08 252/79.1 |
| 2002/0025494 A1* | 2/2002 | Naiini | ....... | G03F 7/029 430/283.1 |
| 2006/0084259 A1* | 4/2006 | Tsai | ....... | H01L 23/3171 438/613 |
| 2007/0281091 A1* | 12/2007 | Kowalski | ....... | C09D 11/30 427/256 |
| 2008/0088322 A1* | 4/2008 | Nagai | ....... | G06K 9/0002 324/671 |
| 2009/0014858 A1* | 1/2009 | Boon | ....... | H01L 21/4853 257/686 |

(Continued)

*Primary Examiner* — Anthony Ho
*Assistant Examiner* — Kevin Quinto
(74) *Attorney, Agent, or Firm* — Slater Matsil, LLP

(57) ABSTRACT

A method of manufacturing a semiconductor device includes placing a polymer raw material mixture over a substrate. The polymer raw material may include a polymer precursor, a photosensitizer, and an additive. The polymer raw material mixture is exposed to radiation to form a dielectric layer and cured at a temperature of between about 150° C. and about 230° C.

20 Claims, 12 Drawing Sheets

(56) References Cited

U.S. PATENT DOCUMENTS

2015/0024326 A1* 1/2015 Nawrocki ............. G03F 7/0045
430/280.1
2017/0110421 A1 4/2017 Liu et al.

* cited by examiner

SEMICONDUCTOR DEVICE AND METHOD

PRIORITY CLAIM AND CROSS-REFERENCE

This application claims priority to U.S. Provisional Patent Application No. 62/378,564, filed on Aug. 23, 2016, "Semiconductor Device and Method", which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
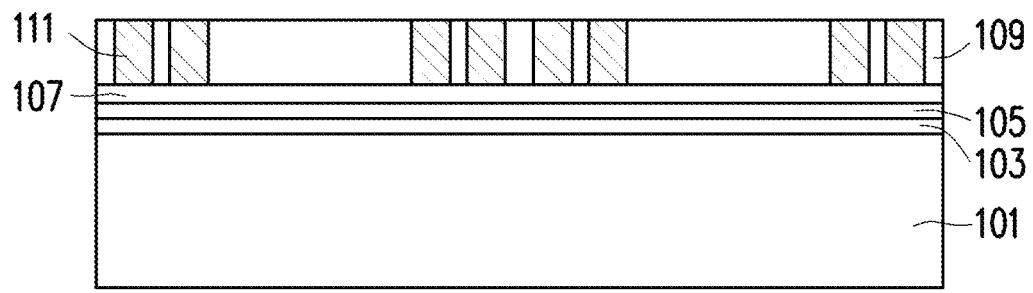
FIG. 1 illustrates a formation of vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a first carrier substrate 101 with an adhesive layer 103, a polymer layer 105, and a first seed layer 107 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the first carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the first carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be a positive tone material such as polybenzoxazole (PBO, such as the material HD8820), although any suitable material, such as polyimide or a polyimide derivative, may also be utilized. The polymer layer 105 may be placed using, e.g., a spin-coating process to a thickness of between about 0.5 μm and about 10 μm, such as about 5 μm, although any suitable method and thickness may be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000

Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 µm and about 1 µm, such as about 0.5 µm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 µm and about 250 µm, such as about 120 µm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device are placed on opposing sides of the vias 111, may be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2:
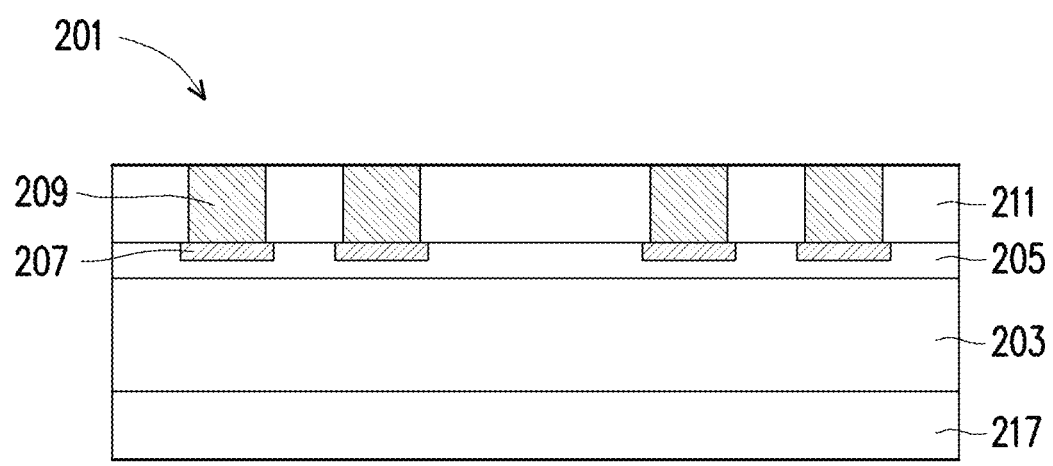
FIG. 2 illustrates a first semiconductor device in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 µm and about 4 µm, such as about 1.45 µm.

The first passivation layer 211 may be formed on the first substrate 203 over the first metallization layers 205 and the first contact pads 207. The first passivation layer 211 may be made of one or more suitable dielectric materials such as polybenzoxazole (PBO), although any suitable material, such as polyimide or a polyimide derivative, may be utilized. The first passivation layer 211 may be placed using, e.g., a spin-coating process to a thickness of between about 5 µm and about 25 µm, such as about 7 µm, although any suitable method and thickness may be used The first external connectors 209 may be formed to provide conductive regions for contact between the first contact pads 207 and, e.g., a first redistribution layer 505

(not illustrated in FIG. 2 but illustrated and described below with respect to FIG. 8B). In an embodiment the first external connectors 209 may be conductive pillars and may be formed by initially forming a photoresist (not shown) over the first passivation layer 211 to a thickness between about 5 µm to about 20 µm, such as about 10 µm. The photoresist may be patterned to expose portions of the first passivation layers 211 through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may be utilized. All suitable processes are fully intended to be included within the scope of the present embodiments.

A die attach film (DAF) 217 may be placed on an opposite side of the first substrate 203 in order to assist in the attachment of the first semiconductor device 201 to the polymer layer 105. In an embodiment the die attach film 217 is an epoxy resin, a phenol resin, acrylic rubber, silica filler, or a combination thereof, and is applied using a lamination technique. However, any other suitable alternative material and method of formation may be utilized.

Figure 3:
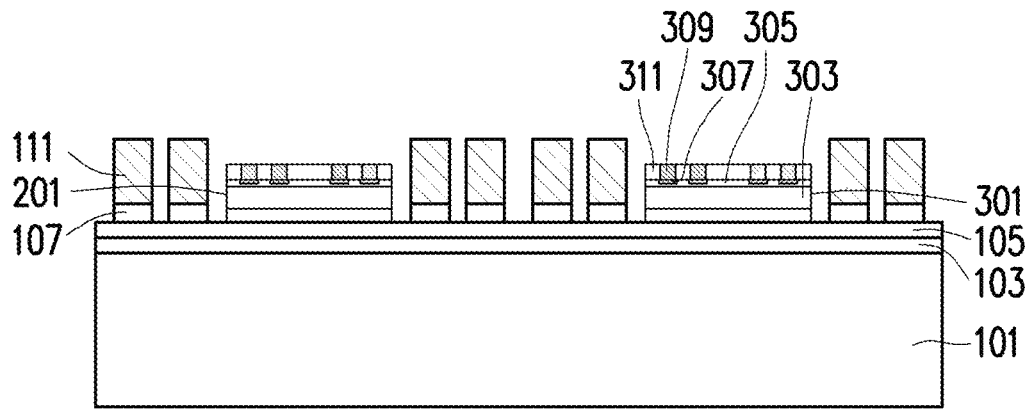
FIG. 3 illustrates a placement of the first semiconductor device and a second semiconductor device in accordance with some embodiments.

FIG. 3 illustrates a placement of the first semiconductor device 201 onto the polymer layer 105 along with a placement of the second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other method of placing the first semiconductor device 201 and the second semiconductor device 301 may also be utilized.

Figure 4:
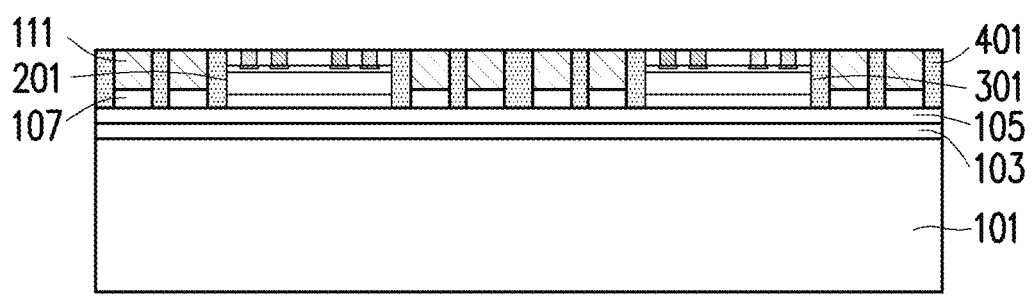
FIG. 4 illustrates an encapsulation of the vias, the first semiconductor device, and the second semiconductor device in accordance with some embodiments.
Figure 5:
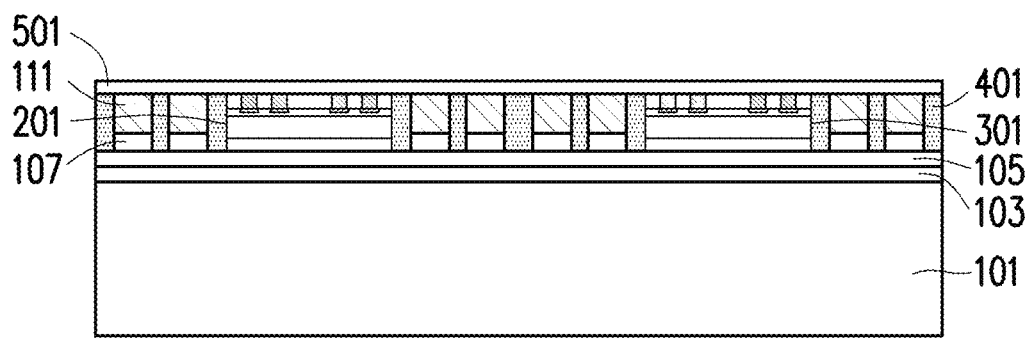
FIG. 5 illustrates a formation of a redistribution passivation layer in accordance with some embodiments.

FIG. 4 illustrates an encapsulation of the vias 111, the first semiconductor device 201 and the second semiconductor device 301. The encapsulation may be performed in a molding device (not illustrated in FIG. 4), which may comprise a top molding portion and a bottom molding portion separable from the top molding portion. When the top molding portion is lowered to be adjacent to the bottom molding portion, a molding cavity may be formed for the first carrier substrate 101, the vias 111, the first semiconductor device 201, and the second semiconductor device 301.

During the encapsulation process the top molding portion may be placed adjacent to the bottom molding portion, thereby enclosing the first carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the first carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (on the first semiconductor device 201), and the second external connectors 309 (on the second semiconductor device 301) have been exposed. As such, the first semiconductor device 201, the second semiconductor device 301, and the vias 111 may have a planar surface that is also planar with the encapsulant 401.

However, while the CMP process described above is presented as one illustrative embodiment, it is not intended to be limiting to the embodiments. Any other suitable removal process may be used to thin the encapsulant 401, the first semiconductor device 201, and the second semiconductor device 301 and expose the vias 111. For example, a series of chemical etches may be utilized. This process and any other suitable process may be utilized to thin the encapsulant 401, the first semiconductor device 201, and the second semiconductor device 301, and all such processes are fully intended to be included within the scope of the embodiments.

FIGS. 5-8B illustrate a formation of a redistribution structure 500 (first labeled in FIG. 8A) over the encapsulant 401 and the now exposed first semiconductor device 201, the second semiconductor device 301, and the vias 111. Looking first at FIG. 5, in an embodiment, the redistribution structure 500 may be formed by initially forming a first redistribution passivation layer 501 over the encapsulant 401. The first redistribution passivation layer 501 may be a dielectric material, such as a low-temperature cured polymer.

In an embodiment, the first redistribution passivation layer 501 may be formed from a polymer material comprising a solvent, a polymer precursor, a cross-linker, and a photosensitizer. The mixture may further comprise an additive. The polymer material may be placed using, e.g., a spin-coating process to a thickness of between about 5 µm and about 17 µm, such as about 7 µm, although any suitable method and thickness may be used. For example, the first redistribution passivation layer 501 may be polyimide, although any suitable material, such as polyacrylate, polybenzoxazole (PBO), a polyimide precursor, or a polyimide derivative, may be utilized.

In one particular embodiment in which the low-temperature cured polyimide is used for the composition, the polymer material may comprise a polymer precursor, such as a low-temperature cured polyimide resin, along with a photosensitizer, cross-linker, and additives placed into a solvent. In an embodiment the low-temperature cured polyimide resin may comprise a polymer that is made up of monomers of the following formula:

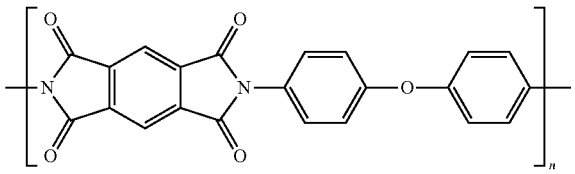

Additionally, while the low-temperature cured polyimide resin may be one of the embodiments as described above, the low-temperature cured polyimide resin is not intended to be limited to only the specific examples described herein. Rather, any suitable low-temperature cured polyimide resin may be utilized, and all such photosensitive polyimide resins are fully intended to be included within the scope of the embodiments. For example, the polymer material may comprise about 20-40% by weight or about 25-35% by weight polymer precursor.

In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent include acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate (EL), propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methyl-2-pyrrolidone or n-methylpyrrolidone (NMP), 2-methoxyethyl ether (diglyme), ethylene glycol monomethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide or dimethylformamide (DMF), N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like. However, as one of ordinary skill in the art will recognize, the chemical compounds listed herein are merely intended as illustrated examples of solvents and are not intended to limit the embodiments to only those solvents specifically described. Rather, any suitable solvent may be utilized, and all such solvents are fully intended to be included within the scope of the present embodiments. Notably, the solvent may compose 30-60% by weight or 55-70% by weight of the polymer material. In addition, the solvent may comprise a mixture of organic materials, such as wherein the polymer material comprises about 45-55% by weight NMP and about 10-15% by weight EL.

The cross-linker forms bonds that link one polymer chain to another. The resulting composition may have a greater rigidity than it otherwise would have without cross-linking. In an embodiment, the cross-linker may comprise any suitable cross-linking agent, such as tetraethylene glycol dimethacrylate (acrylate). wherein the polymer material comprises 1-5% by weight cross-linker.

The photosensitizers, or photoactive components (PACs), may be photoactive components such as photoacid generators, photobase generators, free-radical generators, or the like, and the photosensitizers may be positive-acting or negative-acting. In an embodiment in which the photosensitizers are a photoacid generator, the photosensitizers may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the photosensitizers are a free-radical generator, the photosensitizers may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophene, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the photosensitizers are a photobase generator, the photo sensitizers may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. In an embodiment, a positive tone photosensitizer, such as dibenzolmethanes, or a negative tone photosensitizer, such as 2,2'-(phenylimino)diethanol, may be used as the photosensitizer. However, as one of ordinary skill in the art will recognize, the chemical compounds listed herein are merely intended as illustrated examples of the photosensitizers and are not intended to limit the embodiments to only those photosensitizers specifically described. Rather, any suitable photosensitizer may be utilized, and all such photosensitizers are fully intended to be included within the scope of the present embodiments. The polymer material may comprise about 1-8% by weight photosensitizer.

The additive helps to reduce the temperature needed for curing. In particular, the additive may serve to increase the free volume of the mixture. The high polarity and/or high steric hindrance of the additive may serve to overcome the polarity—e.g., by lowering the dipole moment—of the polymers formed during and after exposure. Consequently, as discussed below, a lower exposure energy may be used. The reduced polarity across the reactive portions of the polymer allow branches of the molecules to come together to form rings and thereby improve the cyclization during curing at the lower temperature. The additive may serve as a catalyst to the reaction and, therefore, remain separate from the polymer before and after curing, although, the final polymer layer or dielectric layer, after curing, may comprise some or all of the original additive.

The additive may comprise any molecule suitable for increasing the free volume of the polymer material or polymer mixture. As discussed above, the additive may have a high polarity and/or high steric hindrance. In order to increase the free volume of the mixture, the additive may be selected and may have a structure similar to the selected cross-linker. For example, the additive may be a polyether, such as polyethylene glycol (PEG) (e.g., at molecular weight 600 and comprising 5% by weight of the polymer material), polypropylene glycol (PPG), combinations of these, or the like. Similarly, in an embodiment in which tetraethylene glycol dimethacrylate is used as the cross-linker, for example, the additive may be one of the compounds listed above, the following compound illustrated below, or a compound with a similar chemical structure. For example, the additive may comprise a long alkyl chain containing an ether group or an end group as follows:

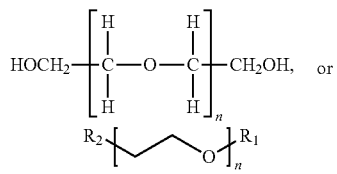

wherein $R_1$ may comprise —H, —Si-Me3, alkyl chain, methyl, or t-butyl, $R_2$ may comprise —H, —SiMe3, alkyl chain, methyl, t-butyl, —OH, —NH$_2$, —SH, —F, —Cl, —Br, —I, —NMe4$^+$, —NR4$^+$, or —SO$_3$H, and wherein n is between about 4 to about 200, although any suitable number may be used.

In another embodiment, the additive may comprise a ring structure. For example, the additive may comprise a phthalate. In addition, any suitable compound with a ring structure may be used.

Furthermore, the additive may comprise polyatomic ions, such as phosphates or nitrates, and their acid derivatives. Any suitable polyatomic ion attached to an organic molecule may be used.

In yet another embodiment the additive may comprise a long alkyl chain containing an ether group or an end group as follows:

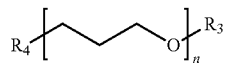

wherein $R_3$ may comprise —H, —Si-Me3, alkyl chain, methyl, or t-butyl, $R_4$ may comprise —H, —Si-Me3, alkyl chain, methyl, t-butyl, —OH, —NH2, —SH, —F, —Cl, —Br, —I, —NMe4+, —NR4+, or —SO$_3$H, and wherein n is between about 4 to about 200, although any suitable number may be used.

In yet another embodiment the additive may comprise a long alkyl chain containing an ether group or an end group as follows:

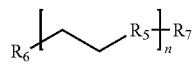

wherein $R_5$ may comprise —NH, —NR, or SiR2, $R_6$ may comprise —H, —Si-Me3, alkyl chain, methyl, or t-butyl, $R_7$ may comprise —H, —Si-Me3, alkyl chain, methyl, t-butyl, —OH, —NH$_2$, —SH, —F, —Cl, —Br, —I, —NMe4+, —NR4+, or —SO$_3$H, and wherein n is between about 4 to about 200, although any suitable number may be used.

In yet another embodiment the additive may comprise a long alkyl chain containing an ether group or an end group as follows:

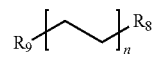

wherein $R_8$ may or may not be the same as $R_9$, wherein $R_8$ and $R_9$ may comprise —H, —Si-Me3, alkyl chain, methyl, t-butyl, —OH, —NH$_2$, —SH, —F, —Cl, —Br, —I, —NMe4+, —NR4+, or SO$_3$H, and wherein n is between about 4 to about 200, although any suitable number may be used.

In yet another embodiment, the additive may comprise a long alkyl chain containing a branch side chain with different end groups as follows:

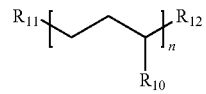

wherein $R_{10}$ may comprise —H, —Si-Me3, alkyl chain, methyl, t-butyl, phenyl, —OH, —NH$_2$, —SH, —F, —Cl, —Br, —I, —NMe4+, —NR4+, or —SO$_3$H, and $R_{11}$ may comprise —H, —Si-Me3, alkyl chain, methyl, or t-butyl, wherein $R_{12}$ may comprise —H, —Si-Me3, alkyl chain, methyl, t-butyl, —OH, —NH$_2$, —SH, —F, —Cl, —Br, —I, —NMe4+, —NR4+, or —SO$_3$H, and wherein n is between about 4 to about 200, although any suitable number may be used.

In yet another embodiment, the additive may comprise a long alkyl chain containing a branch side chain with different end groups as follows:

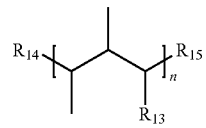

wherein $R_{13}$ may comprise —H, —Si-Me3, alkyl chain, methyl, t-butyl, phenyl, —OH, —NH$_2$, —SH, —F, —Cl, —Br, —I, —NMe4+, —NR4+, or —SO$_3$H, wherein $R_{14}$ may comprise —H, —Si-Me3, alkyl chain, methyl, or t-butyl, wherein $R_{15}$ may comprise —H, —Si-Me3, alkyl chain, methyl, t-butyl, —OH, —NH2, —SH, —F, —Cl, —Br, —I, —NMe4+, —NR4+, or —SO$_3$H, and wherein n is between about 4 to about 200, although any suitable number may be used.

In specific embodiments, the additive may comprise a plasticizer. For example, the additive may be a medium to high molecular weight ester, aromatic carboxylic acid, or aromatic phosphoric acid. Adipates and phthalates, as discussed above, may also be used. Consequently, the additive may comprise one or more of the following plasticizers:

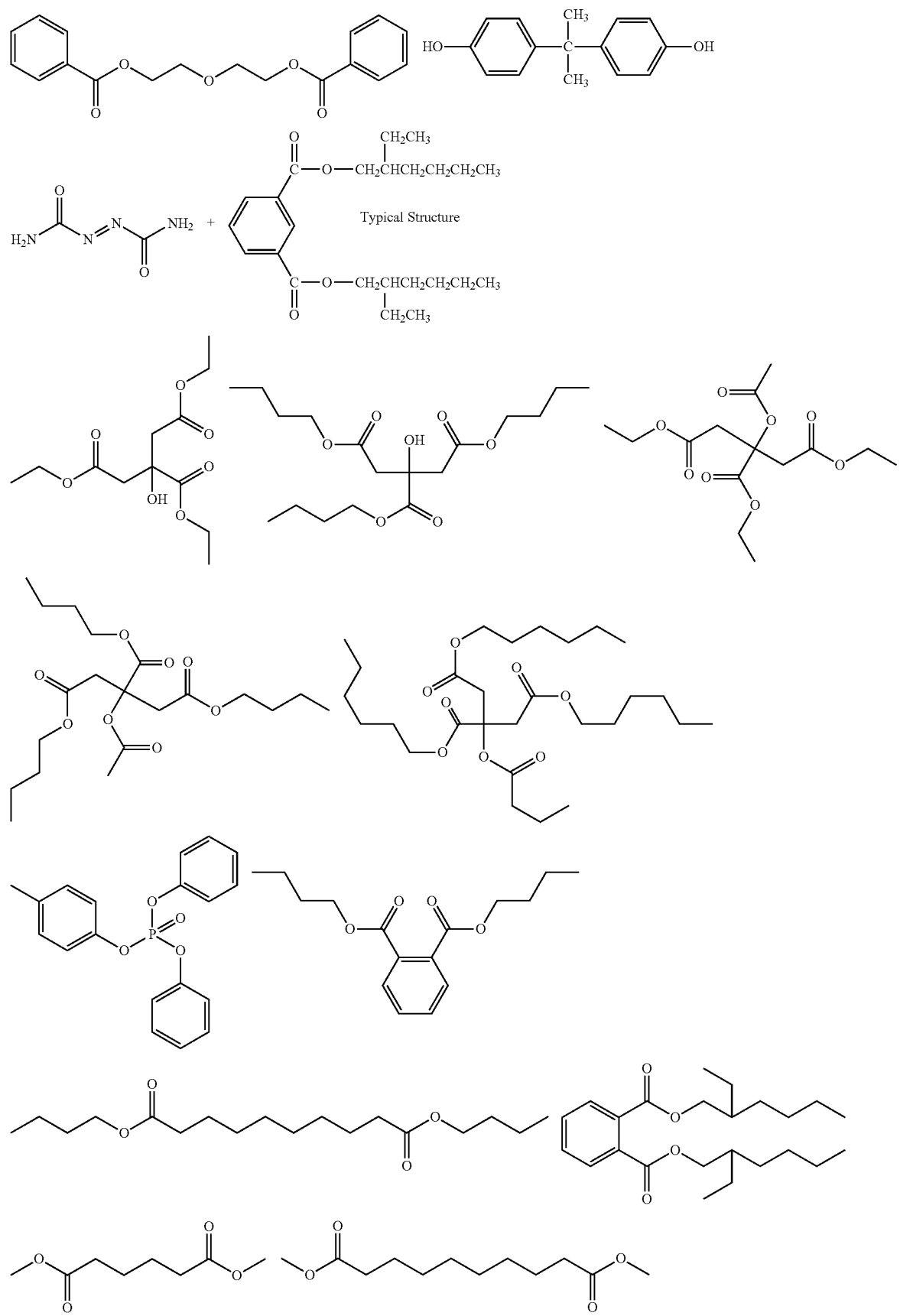

-continued
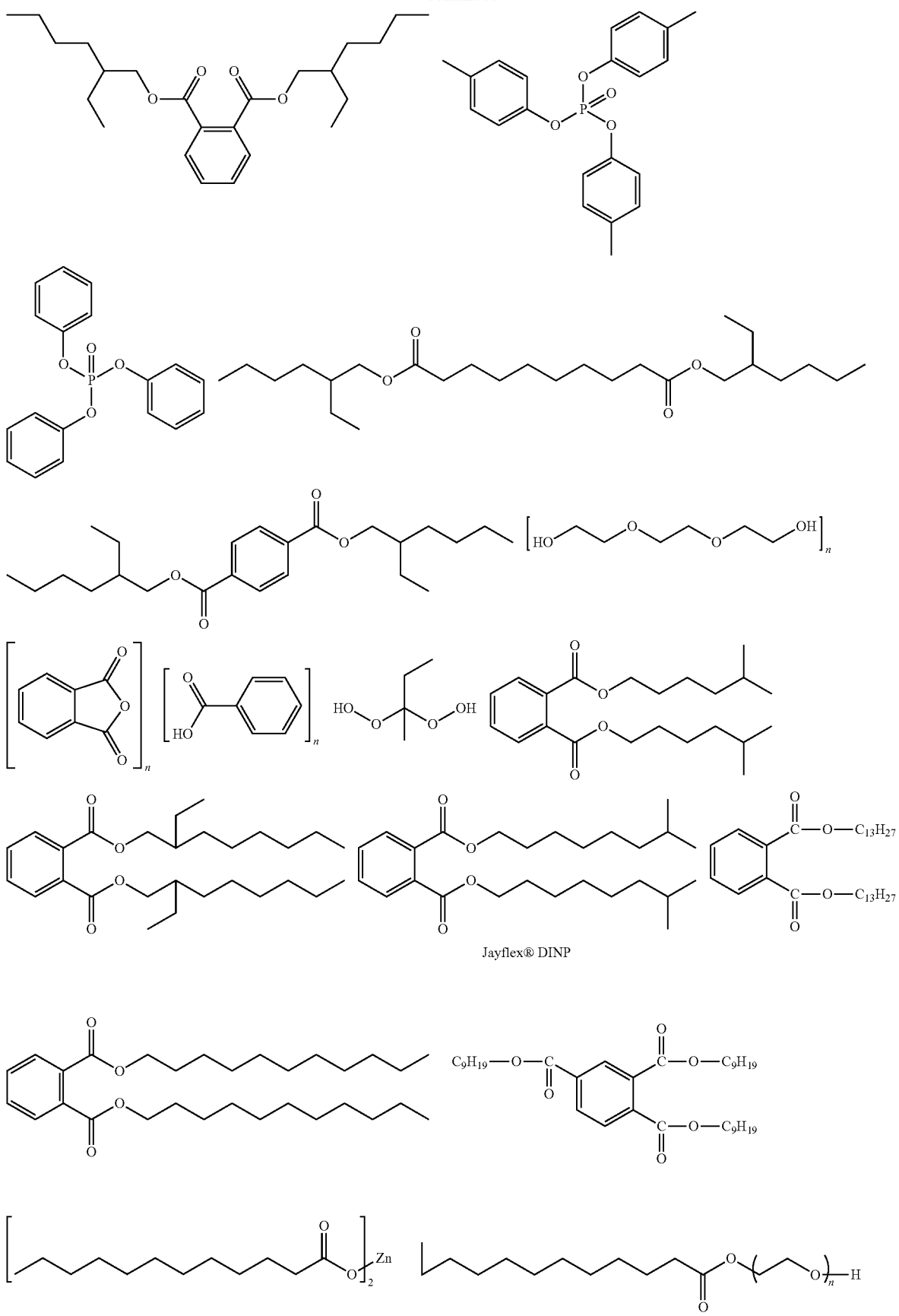
Jayflex® DINP

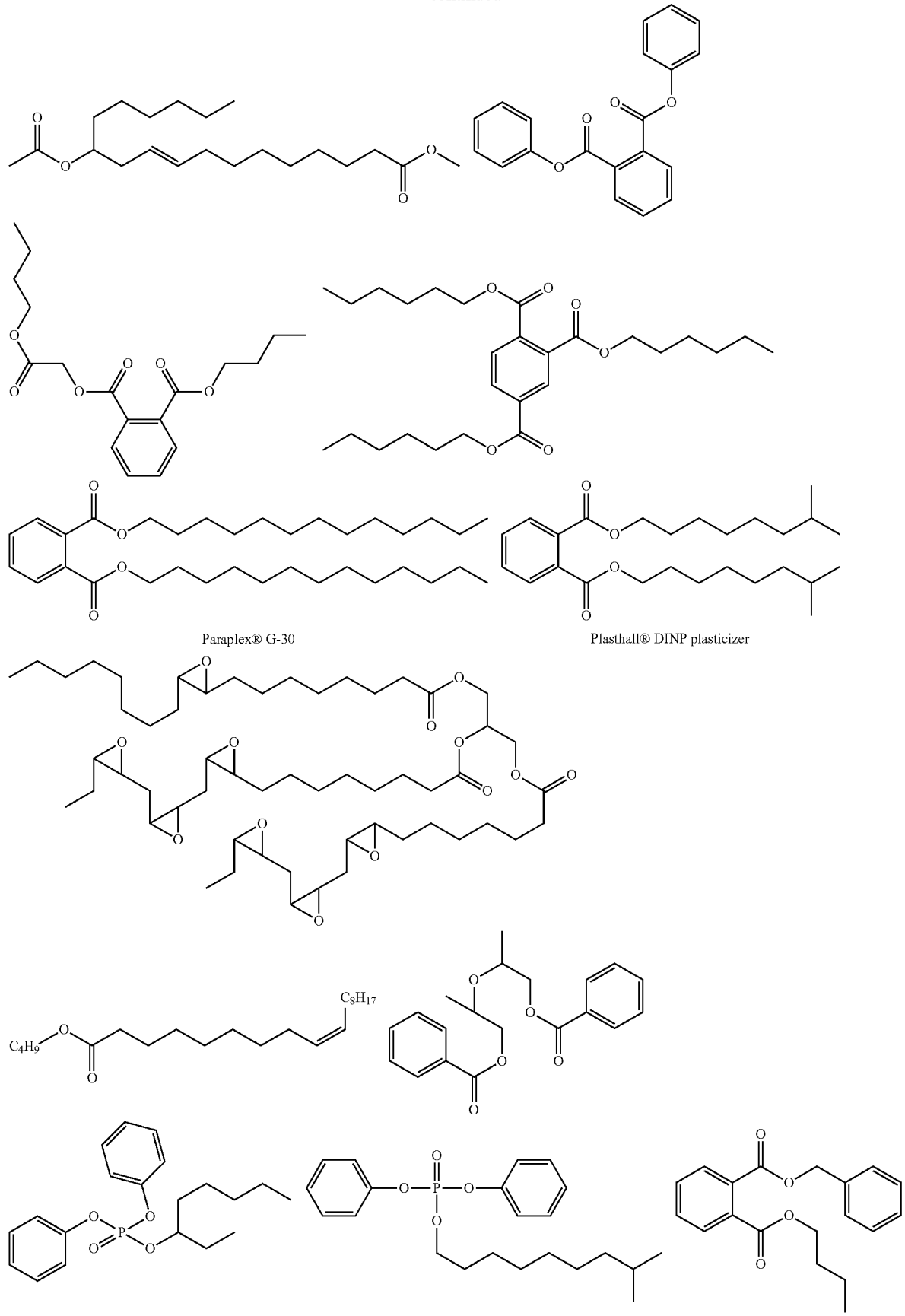

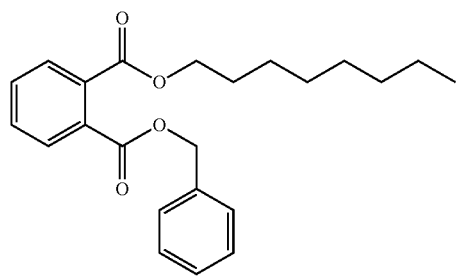
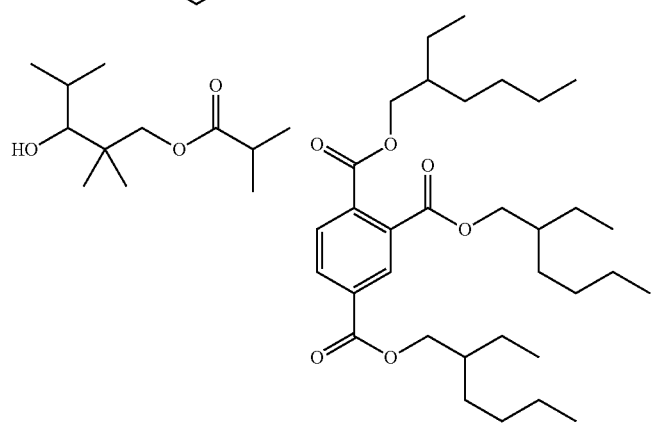

However, as one of ordinary skill in the art will recognize, the chemical compounds listed herein are merely intended as illustrated examples of the additives and are not intended to limit the embodiments to only those additives specifically described. Rather, any suitable additive may be utilized, and all such additives are fully intended to be included within the scope of the present embodiments. In an embodiment, the polymer material comprises 1-10% by weight additive, e.g., 3% or 5% by weight additive.

Once ready, the first redistribution passivation layer 501 may be utilized by initially applying the polymer material onto the encapsulant 401, the exposed first semiconductor device 201, the second semiconductor device 301, and the vias 111. The first redistribution passivation layer 501 may be applied so that the first redistribution passivation layer 501 coats an upper exposed surface of the encapsulant 401, the exposed first semiconductor device 201, the second semiconductor device, and vias 111, and may be applied using a process such as a spin-on coating process, a dip coating method, an air-knife coating method, a curtain coating method, a wire-bar coating method, a gravure coating method, a lamination method, an extrusion coating method, combinations of these, or the like. The first redistribution passivation layer 507 may be placed to a thickness of between about 7 μm to about 35 μm.

Once applied, the first redistribution passivation layer 501 may be baked in order to cure and dry the first redistribution passivation layer 501 prior to exposure (described further below). The curing and drying of the first redistribution passivation layer 501 removes the solvent component while leaving behind the resin, the photosensitizers, the cross-linkers, and any other chosen additives. In an embodiment the pre-bake may be performed at a temperature suitable to evaporate the solvent, such as between about 40° C. and 150° C., such as about 150° C., although the precise temperature depends upon the materials chosen for the second redistribution passivation layer 507. The pre-bake is performed for a time sufficient to cure and dry the second redistribution passivation layer 507, such as between about 10 seconds to about 5 minutes, such as about 270 seconds.

Figure 6A:
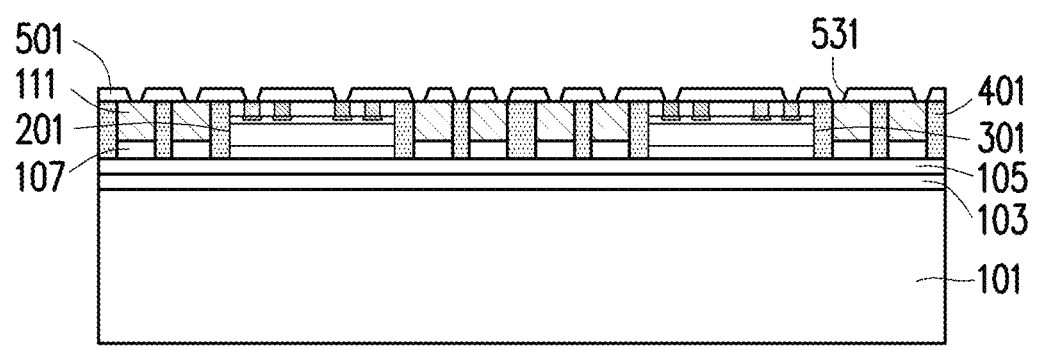
FIGS. 6A-6E further illustrate the formation of the redistribution passivation layer in accordance with some embodiments.

As illustrated in FIG. 6A, once the first redistribution passivation layer 501 has been placed, the first redistribution passivation layer 501 is patterned to form openings 531 using, e.g., a photolithographic masking and etching process or, if the material of the first redistribution passivation layer 501 is photosensitive, exposing and developing the material of the first redistribution passivation layer 501.

In an embodiment the energy source supplies energy such as light to the first redistribution passivation layer 501 in order to induce a reaction of the photosensitizers, which in turn reacts with the first redistribution passivation layer polymer resin to chemically alter those portions of the first redistribution passivation layer 501 to which the energy impinges. In an embodiment the energy may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy, such as mercury vapor lamps, xenon lamps, carbon arc lamps or the like, may also be utilized.

A patterned mask is located between the energy source and the first redistribution passivation layer 501 in order to block portions of the energy to form a patterned energy prior to the energy actually impinging upon the first redistribution passivation layer 501. In an embodiment the patterned mask may comprise a series of layers (e.g., substrate, absorbance layers, anti-reflective coating layers, shielding layers, etc.) to reflect, absorb, or otherwise block portions of the energy from reaching those portions of the first redistribution passivation layer 501 which are not desired to be illuminated. The desired pattern may be formed in the patterned mask by forming openings through the patterned mask in the desired shape of illumination.

In an embodiment the first redistribution passivation layer 501 is placed on a support plate. Once the pattern has been aligned to the first redistribution passivation layer 501, the energy source generates the desired energy (e.g., light) which passes through the patterned mask on its way to the first redistribution passivation layer 501. The patterned energy impinging upon portions of the first redistribution passivation layer 501 induces a reaction of the photosensitizers within the first redistribution passivation layer 501. The chemical reaction products of the photosensitizers' absorption of the patterned energy (e.g., acids/bases/free radicals) then reacts with the second redistribution passivation layer polymer resin, chemically altering the first redistribution passivation layer 501 in those portions that were illuminated through the patterned mask.

In an embodiment, the exposure may proceed with a bottom critical dimension (BCD) at between about 2 μm and 200 μm, such as about 10 μm. In addition, the exposure latitude (EL) may be greater than about 33% or greater than about 50%, the depth of focus (DOF) at between about −50 μm and 50 μm, such as 18 μm, the exposure energy between about 60 mJ and 200 mJ, and may be less than 220 mJ or 225, such as a reduction by about 22% to about 175 mJ, and the focus at between about 30 μm and 48 μm, such as 36 μm.

Figure 6B:
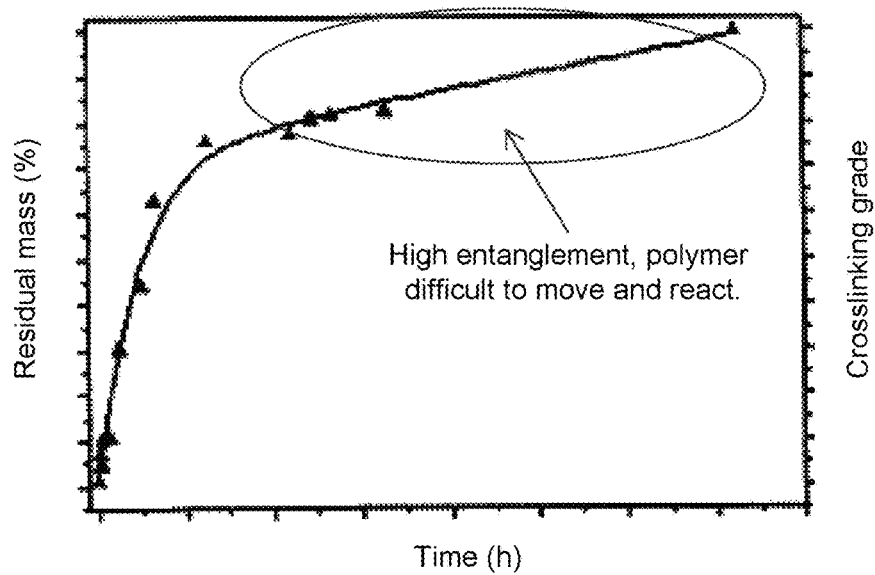
Figure 6B:
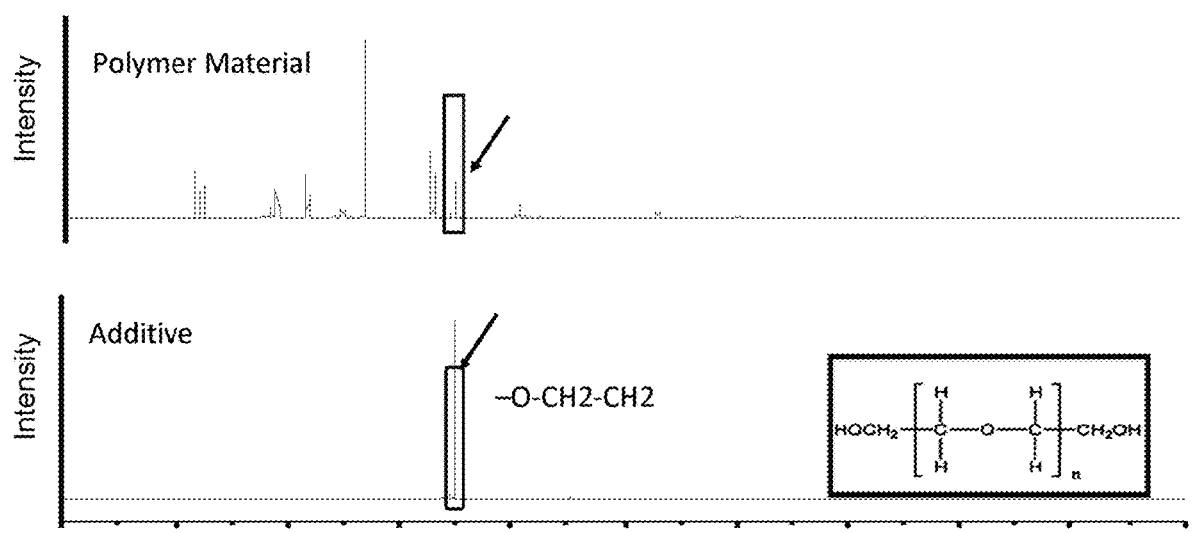

FIG. 6B provides crosslinking and NMR results illustrating the inclusion of the additive with the polymer material. The crosslinking grade shows a high entanglement of the polymer, which makes it less likely to move and react. As discussed above, the mobility is improved by the increase in free volume provided by the additive. In FIG. 6B, the —O—CH$_2$—CH$_2$ structure is observed at 3.5 ppm in the NMR results for a polymer material comprising about 45-55% NMP as a solvent, about 10-15% EL as another solvent, about 25-35% polyamic acid ester as a polymer precursor, about 1-5% tetraethylene glycol dimethacrylate as the cross-linker, and about 1-8% 2,2'-(phenylimino)diethanol as a photosensitizer, and about 1-10%, or 5%, of the following additive:

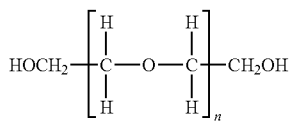

Figure 6C:
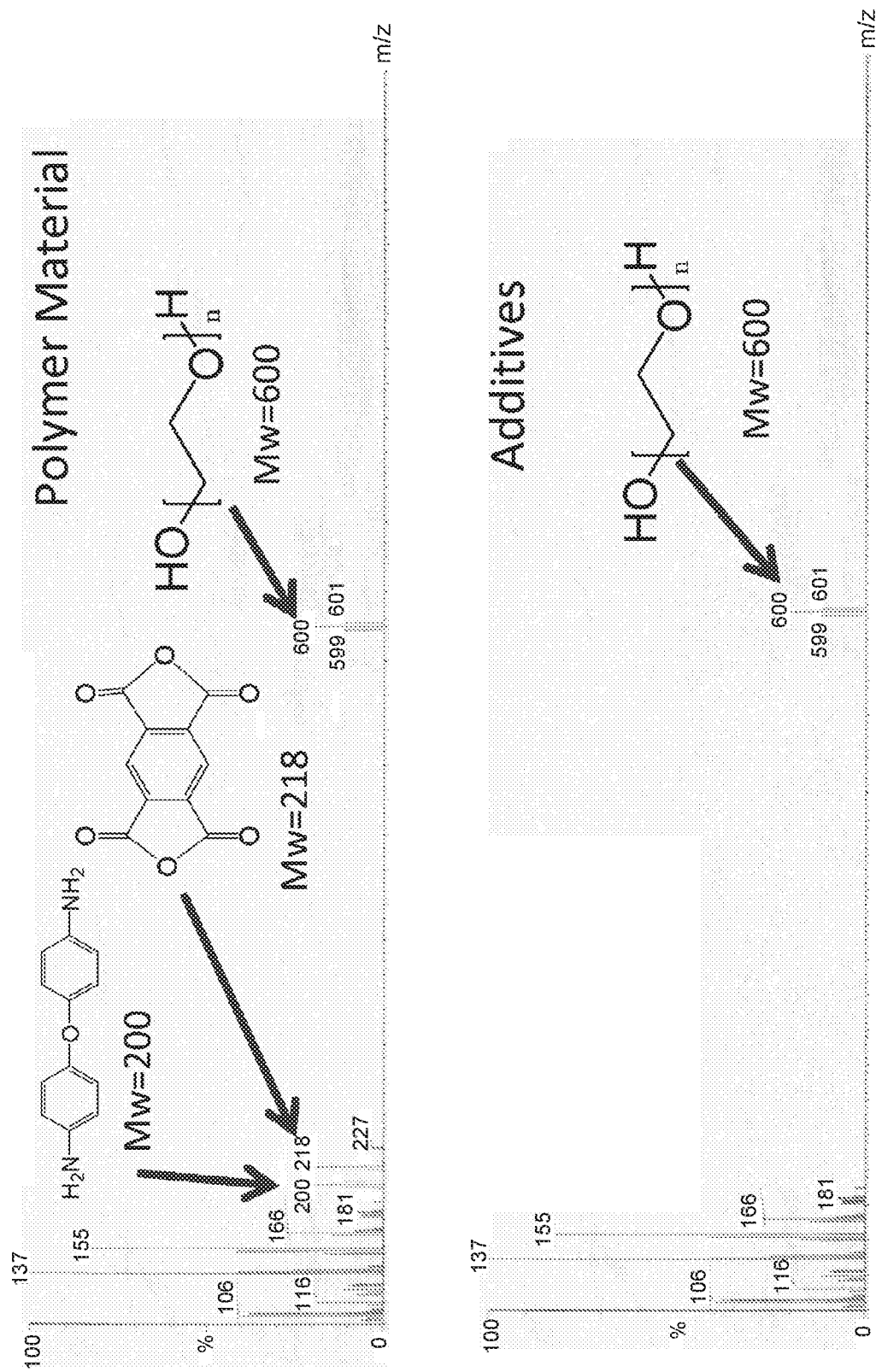

FIG. 6C provides mass analysis results illustrating the inclusion of another embodiment of the additive with the polymer material. The additive, at about 600 molecular weight, comprises the following chemical structure:

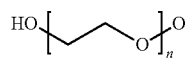

Figure 6D:
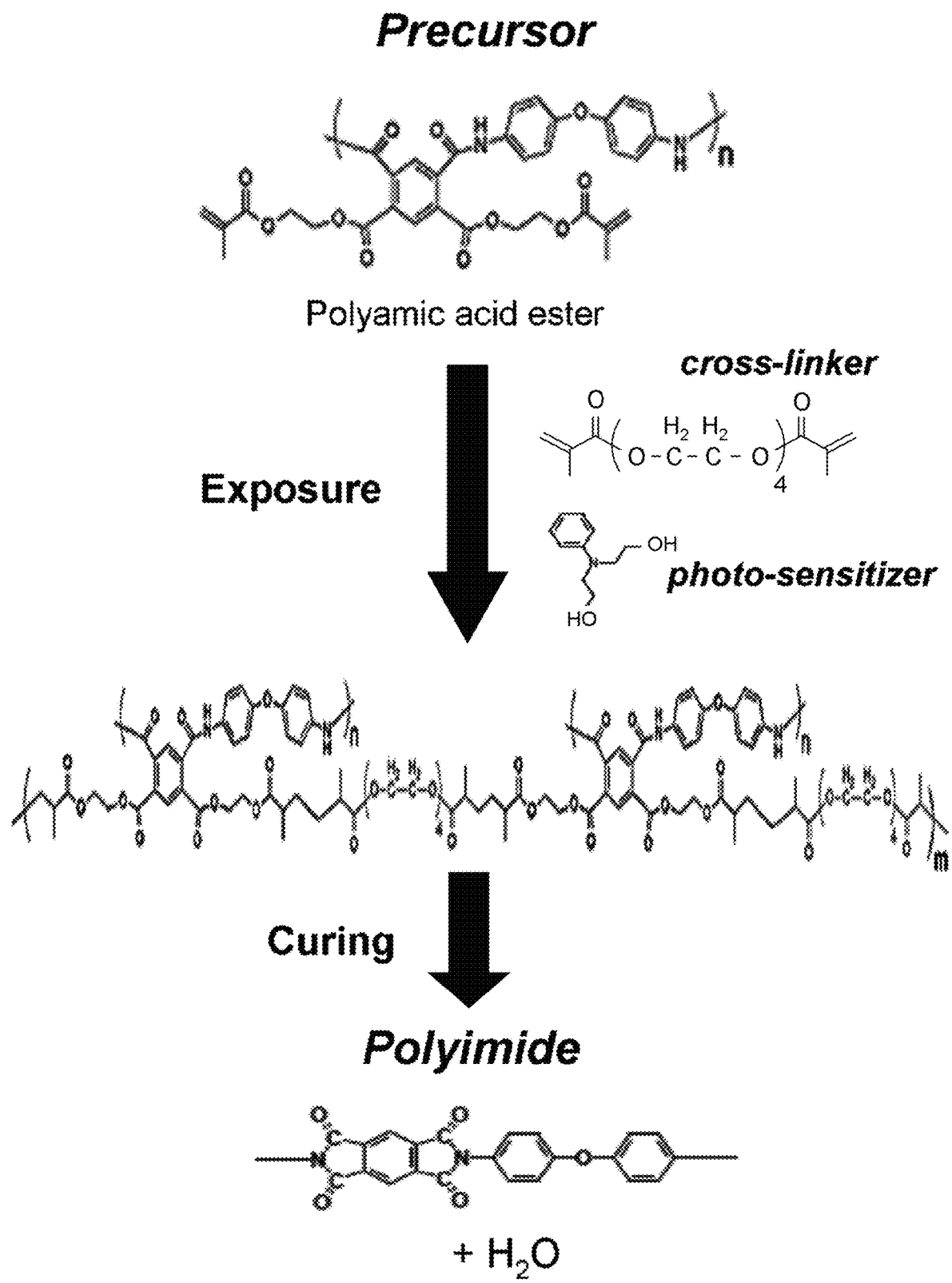

As described in detail below, the polymer material may undergo a series of reactions. The chemical mechanisms of those reactions are illustrated in FIG. 6D.

After the first redistribution passivation layer 501 has been exposed, a first post-exposure bake (PEB) may be used in order to assist in the generating, dispersing, and reacting of the acid/base/free radical generated from the impingement of the energy upon the photosensitizers during the exposure. Such assistance helps to create or enhance chemical reactions which generate chemical differences and different polarities between those regions impinged by the energy and those regions that were not impinged by the energy. These chemical differences also cause differences in the solubility between the regions impinged by the energy and those regions that were not impinged by the energy. In an embodiment the temperature of the first redistribution passivation layer 501 may be increased to between about 70° C. and about 150° C. for a period of between about 40 seconds and about 120 seconds, such as about 2 minutes. In a particular, embodiments, the post-development bake may be performed at temperatures of 140° C., 150° C., 130° C., 110° C., 90° C. and 70° C., each for about 2 minutes.

Once the first redistribution passivation layer 501 has been exposed and baked, the first redistribution passivation layer 501 may be developed with the use of a developer. In an embodiment in which the first redistribution passivation layer 501 is the low temperature cured polyimide, the first developer may be an organic solvent or critical fluid may be utilized to remove those portions of the first redistribution passivation layer 501 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include cyclopentanon (A515), hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

The first developer may be applied to the first redistribution passivation layer 501 using, e.g., a spin-on process. In this process the first developer is applied to the first redistribution passivation layer 501 from above the second redistribution passivation layer 507 while the first redistribution passivation layer 501 is rotated. In an embodiment the first developer may be at a temperature of between about 10° C. and about 80° C., such as about 50° C., and the development may continue for between about 1 minute to about 60 minutes, such as about 30 minutes.

However, while the spin-on method described herein is one suitable method for developing the first redistribution passivation layer 501 after exposure, it is intended to be illustrative and is not intended to limit the embodiments. Rather, any suitable method for development, including dip processes, puddle processes, spray-on processes, combinations of these, or the like, may be used. All such development processes are fully intended to be included within the scope of the embodiments.

Once the first redistribution passivation layer 501 has been developed, the first redistribution passivation layer 501 may be rinsed. In an embodiment the first redistribution passivation layer 501 may be rinsed with a rinsing liquid such as propylene glycol monomethyl ether acetate (C260), although any suitable rinse solution, such as water, may be used.

After development a post development baking process may be utilized in order to help polymerize and stabilize the first redistribution passivation layer 501 after the development process. In an embodiment the post-developing baking process may be performed at a temperature of between about 80° C. and about 200° C., or between about 80° C. and about 170° C., such as about 140° C. for a time of between about 60 sec and about 300 sec, such as about 2 minutes.

After the post-development baking and the RDL surface treatments, the first redistribution passivation layer 501 may be cured. In an embodiment in which the first redistribution passivation layer 501 comprises a low temperature cured polyimide, the curing process may be performed at a low temperature of less than about 230° C., such as a temperature of between about 200° C. and 230° C., such as about 220° C., or a low temperature less than about 170° C., such as a temperature between 150° C. and 200° C., or about 170° C. for a time of between about 1 hour and about 2 hours. The temperature may begin at about 23° C. and increase at a rate of about 0.5° C. to about 10° C., e.g., at a rate of about 4.5° C. The system is cooled down at a rate of about 0.5° C./min to about 10° C./min, such as about 1° C./min. In particular embodiments the curing process may be performed at a temperature of about 170° C. for about 1 hour, a temperature of about 180° C. for a time of about 1 hour, or at a temperature of about 160° C. for a time of about 2 hours. However, any suitable temperature and time may be utilized.

Figure 6E:
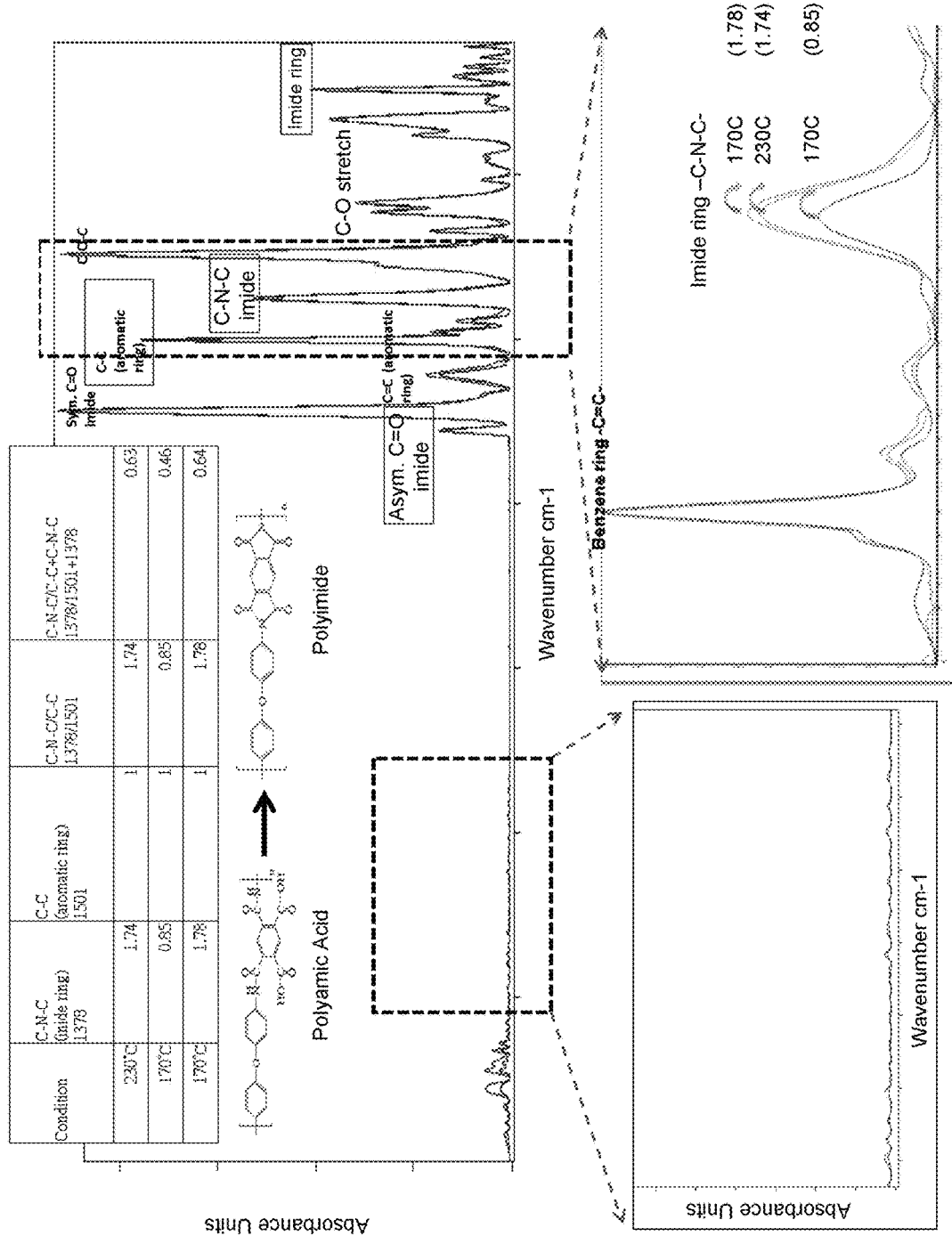

FIG. 6E provides test data for embodiments comprising the additive, illustrating the polyimide cyclization using a 1378 cm$^{-1}$/501 cm$^{-1}$ Fourier transform infrared spectroscopy (FTIR) ratio. In particular, the low temperature cured polyimide as described herein has a polyimide cyclization of about 1.78 at a 170° C. curing temperature. By comparison a polymer material without the additive may yield a polyimide cyclization of about 1.74 at a 230° C. curing temperature or about 0.85 at a 170° C. curing temperature.

By curing the first redistribution passivation layer 501 with the additive, a high level of polyimide cyclization may be achieved. For example, curing the polymer material comprising 3% additive up to about 170° C. may yield a film with over about 82% cyclization, such as about 98% cyclization, about 67% elongation, a tensile strength of about 175 MPa, a Young's Modulus of about 3.8 GPa, a thermogravimetric analysis decomposition temperature (TGA-T$_d$) of about 300° C., and a glass transition temperature through dynamic mechanical analysis (T$_g$ (DMA)) of about 205° C. For another example, curing the polymer material comprising 5% additive up to about 170° C. may yield a film with about 100% cyclization, about 83% elongation, a tensile strength of about 180 MPa, a Young's Modulus of about 3.4 GPa, a decomposition temperature (TGA-T$_d$) of about 311° C., and a glass transition temperature (T$_g$ (DMA)) of about 205° C.

By forming the first redistribution passivation layer 501 from a material such as the low temperature cured polyimide, a material with an increased adhesion to the underlying layers may be obtained. This increased adhesion leads to a reduction or even an elimination of delamination between the first redistribution passivation layer 501 and the underlying layers and components during subsequent processing and use.

Figure 7:
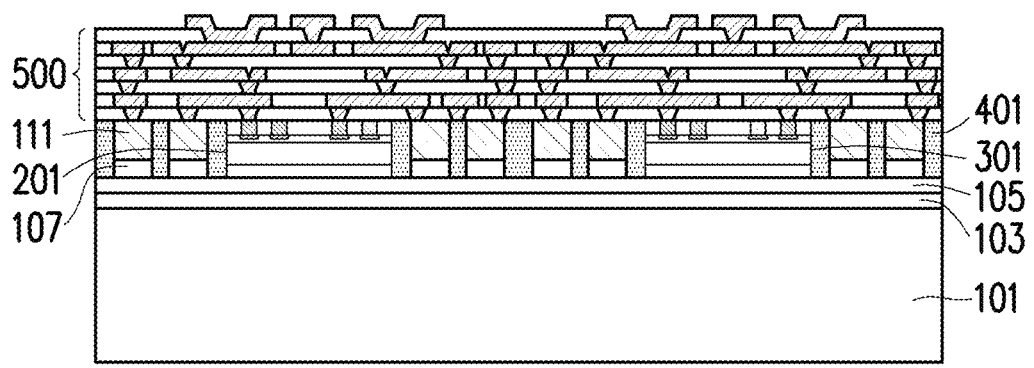
FIG. 7 illustrates a formation of a redistribution structure in accordance with some embodiments.
Figure 8A:
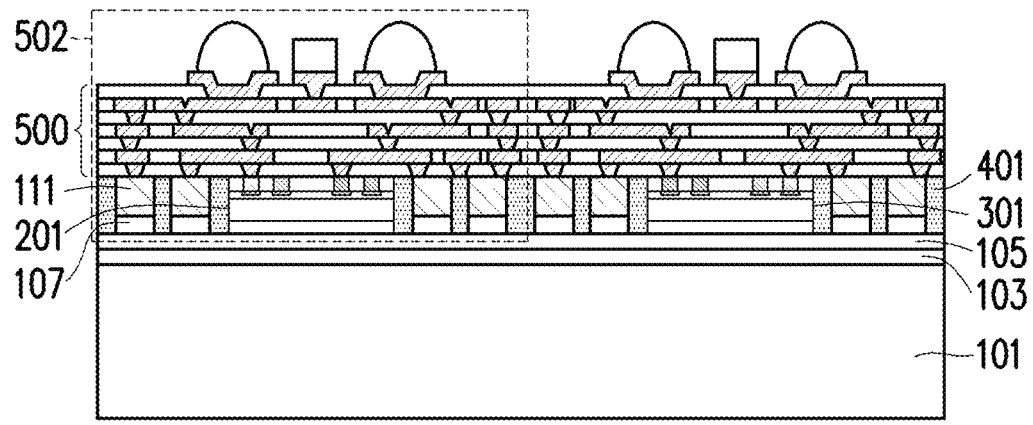
FIGS. 8A-8B further illustrate the formation of the redistribution structure in accordance with some embodiments.
Figure 8B:
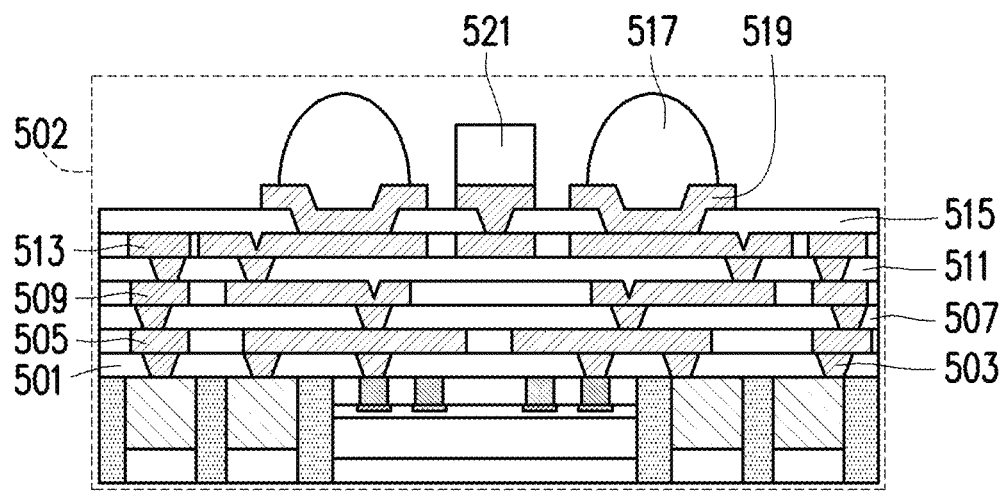

As illustrated in FIGS. 7-8B, once the first redistribution passivation layer 501 has been cured, first redistribution vias 503 may be formed in the openings 531 through the first redistribution passivation layer 501 in order to make electrical connections to the first semiconductor device 201, the second semiconductor device 301, and the vias 111. The openings 531 may be filled with a conductive material such as copper and any excess material is removed using, e.g., a planarization process such as chemical mechanical polishing. However, any suitable process or materials may be utilized.

After the first redistribution vias 503 have been formed, a first redistribution layer 505 is formed over an in electrical connection with the first redistribution vias 503. In an embodiment the first redistribution layer 505 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 505 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the first redistribution layer 505.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

Optionally, if desired, after the first redistribution layer 505 has been formed, a surface treatment of the first redistribution layer 505 may be performed in order to help protect the first redistribution layer 505. In an embodiment the surface treatment may be a descum treatment such as a plasma treatment wherein the surface of the first redistribution layer 505 is exposed to a plasma of, e.g., argon, nitrogen, oxygen or a mixed Ar/N2/O2 ambient environment in order to improve the interface adhesion between the first redistribution layer 505 and overlying layers (e.g., the second redistribution passivation layer 507). However, any suitable surface treatment may be utilized.

After the first redistribution layer 505 has been formed, a second redistribution passivation layer 507 may be formed to help isolate the first redistribution layer 505. In an embodiment the second redistribution passivation layer 507 may be a different material than the first redistribution passivation layer 501 and may be, for example, another dielectric material such as PBO. Optionally, the second redistribution passivation layer 507 may be formed of a similar material as the first redistribution passivation layer 501, and it may be placed, exposed, developed, and/or cured similarly as the first redistribution passivation layer 501 or as described above in connection with the first redistribution passivation layer 501.

After the second redistribution passivation layer 507 has been patterned, a second redistribution layer 509 may be formed to extend through the openings formed within the second redistribution passivation layer 507 and make electrical connection with the first redistribution layer 505. In an embodiment the second redistribution layer 509 may be formed using materials and processes similar to the first redistribution layer 505. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

After the second redistribution layer 509 has been formed, a third redistribution passivation layer 511 is applied over the second redistribution layer 509 in order to help isolate and protect the second redistribution layer 509. In an embodiment the third redistribution passivation layer 511 may be formed of similar materials and in a similar fashion as the second redistribution passivation layer 507. For example, the third redistribution passivation layer 511 may be formed of a low-temperature cured polyimide that has been applied and patterned as described above with respect to the second redistribution passivation layer 507. However, any suitable material or process of manufacture may be utilized.

After the third redistribution passivation layer 511 has been patterned, a third redistribution layer 513 may be formed to extend through the openings formed within the third redistribution passivation layer 511 and make electrical connection with the second redistribution layer 509. In an embodiment the third redistribution layer 513 may be formed using materials and processes similar to the first redistribution layer 505. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

After the third redistribution layer 513 has been formed, a fourth redistribution passivation layer 515 may be formed over the third redistribution layer 513 in order to help isolate and protect the third redistribution layer 513. In an embodiment the fourth redistribution passivation layer 515 may be formed of similar materials and in a similar fashion as the second redistribution passivation layer 507. For example, the fourth redistribution passivation layer 515 may be formed of a low-temperature cured polyimide that has been applied and patterned as described above with respect to the second redistribution passivation layer 507. However, any suitable material or process of manufacture may be utilized.

FIGS. 7-8B further illustrate a formation of underbump metallizations 519 and third external connectors 517 to make electrical contact with the third redistribution layer 513. In an embodiment the underbump metallizations 519 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 519. Any suitable materials or layers of material that may be used for the underbump metallizations 519 are fully intended to be included within the scope of the embodiments.

In an embodiment the underbump metallizations 519 are created by forming each layer over the third redistribution layer 513 and along the interior of the openings through the fourth redistribution passivation layer 515. The forming of each layer may be performed using a plating process, such as electrochemical plating, although other processes of formation, such as sputtering, evaporation, or PECVD process, may be used depending upon the desired materials. The underbump metallizations 519 may be formed to have a thickness of between about 0.7 µm and about 10 µm, such as about 5 µm.

In an embodiment the third external connectors 517 may be placed on the underbump metallizations 519 and may be a ball grid array (BGA) which comprises a eutectic material such as solder, although any suitable materials may be used. In an embodiment in which the third external connectors 517 are solder balls, the third external connectors 517 may be formed using a ball drop method, such as a direct ball drop process, or using a ball mount and laser drill process. In addition, the solder balls may be formed by initially forming a layer of tin through any suitable method such as evaporation, electroplating, printing, solder transfer, and then performing a reflow in order to shape the material into the desired bump shape. Once the third external connectors 517 have been formed, a test may be performed to ensure that the structure is suitable for further processing.

Additionally, a surface device 521 may also be placed in contact with the third redistribution layer 513 through the underbump metallizations 519. The surface device 521 may be used to provide additional functionality or programming to the first semiconductor device 201, the second semiconductor device 301, or the package as a whole. In an embodiment the surface device 521 may be a surface mount device (SMD) or an integrated passive device (IPD) that comprises passive devices such as resistors, inductors, capacitors, jumpers, combinations of these, or the like that are desired to be connected to and utilized in conjunction with the first semiconductor device 201 or the second semiconductor device 301, or other parts of the package.

The surface device 521 may be connected to the underbump metallizations 519, for example, by sequentially dipping connectors such as solder balls (not separately illustrated in FIGS. 7-8B) of the surface device 521 into flux, and then using a pick-and-place tool in order to physically align the connectors of the surface device 521 with individual ones of the underbump metallizations 519. In an embodiment in which the surface device 521 uses connectors such as solder balls, once the surface device 521 has been placed a reflow process may be performed in order to physically bond the surface device 521 with the underlying underbump metallizations 519 and a flux clean may be performed. However, any other suitable connector or connection process may be utilized, such as metal-to-metal bonding or the like.

Figure 9:
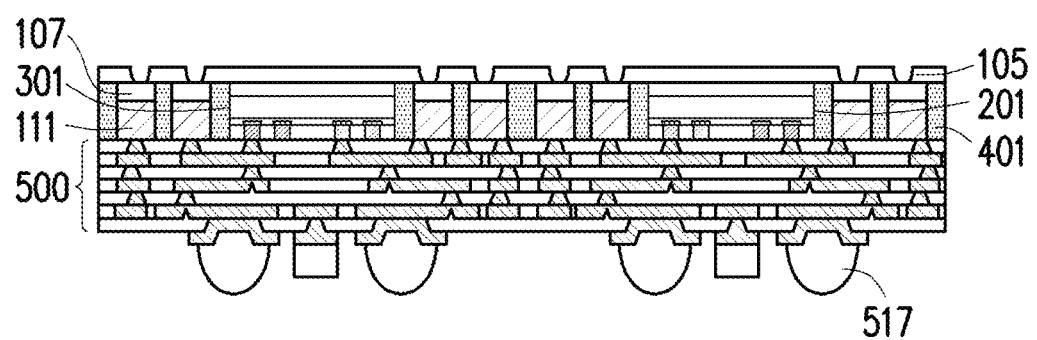
FIG. 9 illustrates an exposure of the vias in accordance with some embodiments.

FIG. 9 illustrates a debonding of the first carrier substrate 101 from the first semiconductor device 201 and the second semiconductor device 301. In an embodiment the third external connectors 517 and, hence, the structure including the first semiconductor device 201 and the second semiconductor device 301, may be attached to a ring structure (not separately illustrated in FIG. 9). The ring structure may be a metal ring intended to provide support and stability for the structure during and after the debonding process. In an embodiment the third external connectors 517, the first semiconductor device 201, and the second semiconductor device 301 are attached to the ring structure using, e.g., an ultraviolet tape (also not illustrated in FIG. 9), although any other suitable adhesive or attachment may be used.

Once the third external connectors 517 and, hence, the structure including the first semiconductor device 201 and the second semiconductor device 301 are attached to the ring structure, the first carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the third external connectors 517, the first semiconductor device 201, and the second semiconductor device 301.

However, while a ring structure may be used to support the third external connectors 517, such as description is merely one method that may be used and is not intended to be limiting upon the embodiments. In another embodiment the third external connectors 517 may be attached to a second carrier substrate using, e.g., a first glue. In an embodiment the second carrier substrate is similar to the first carrier substrate 101, although it may also be different. Once attached, the adhesive layer 103 may be irradiated and the adhesive layer 103 and the first carrier substrate 101 may be physically removed.

FIG. 9 also illustrates a patterning of the polymer layer 105 in order to expose the vias 111 (along with the associated first seed layer 107). In an embodiment the polymer layer 105 may be patterned using, e.g., a laser drilling method. In such a method a protective layer, such as a light-to-heat conversion (LTHC) layer or a hogomax layer (not separately illustrated in FIG. 9) is first deposited over the polymer layer 105. Once protected, a laser is directed towards those portions of the polymer layer 105 which are desired to be removed in order to expose the underlying vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form openings over the vias 111 to have a width of between about 100 µm and about 300 µm, such as about 200 µm.

In another embodiment, the polymer layer 105 may be patterned by initially applying a photoresist (not individually illustrated in FIG. 9) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 10:
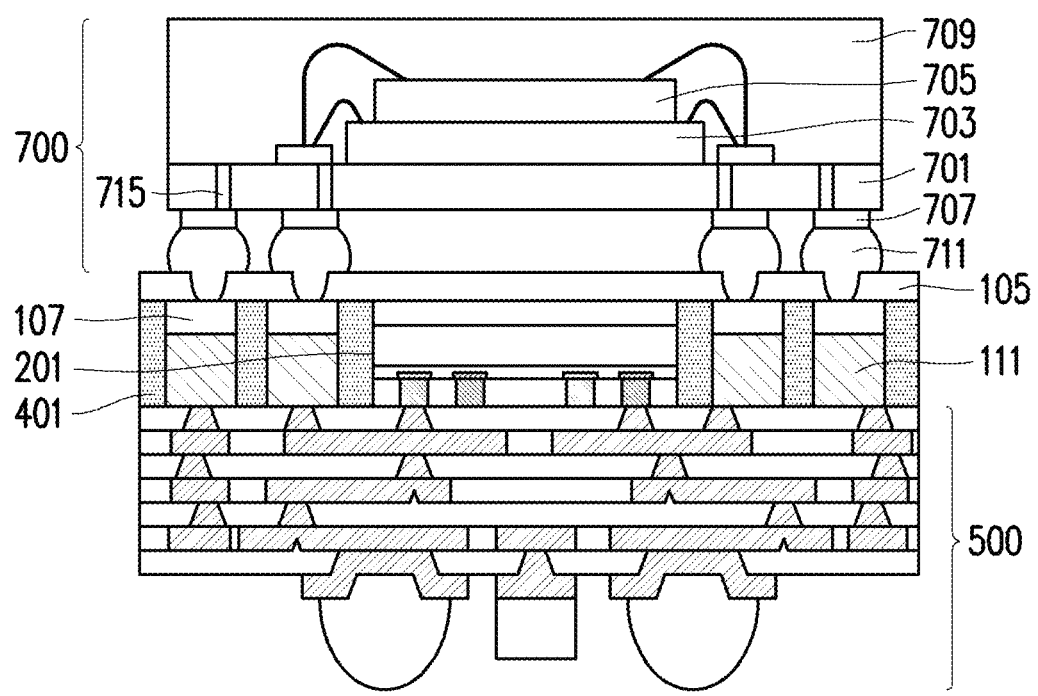
FIG. 10 illustrates a bonding of a package in accordance with some embodiments.

FIG. 10 illustrates a bonding of a first package 700. In an embodiment the first package 700 may comprise a third substrate 701, a third semiconductor device 703, a fourth semiconductor device 705 (bonded to the third semiconductor device 703), third contact pads 707, a second encapsulant 709, and fourth external connections 711. In an embodiment the third substrate 701 may be, e.g., a packaging substrate comprising internal interconnects (e.g., through substrate vias 715) to connect the third semiconductor device 703 and the fourth semiconductor device 705 to the vias 111.

In addition, the third substrate 701 may be an interposer used as an intermediate substrate to connect the third semiconductor device 703 and the fourth semiconductor device 705 to the vias 111. In this embodiment the third substrate 701 may be, e.g., a silicon substrate, doped or undoped, or an active layer of a silicon-on-insulator (SOI) substrate. However, the third substrate 701 may also be a glass substrate, a ceramic substrate, a polymer substrate, or any other substrate that may provide a suitable protection and/or interconnection functionality. These and any other suitable materials may be used for the third substrate 701.

The third semiconductor device 703 may be a semiconductor device designed for an intended purpose such as being a logic die, a central processing unit (CPU) die, a memory die (e.g., a DRAM die), combinations of these, or the like. In an embodiment the third semiconductor device 703 comprises integrated circuit devices, such as transistors, capacitors, inductors, resistors, first metallization layers (not shown), and the like, therein, as desired for a particular functionality. In an embodiment the third semiconductor device 703 is designed and manufactured to work in conjunction with or concurrently with the first semiconductor device 201.

The fourth semiconductor device 705 may be similar to the third semiconductor device 703. For example, the fourth semiconductor device 705 may be a semiconductor device designed for an intended purpose (e.g., a DRAM die) and comprising integrated circuit devices for a desired functionality. In an embodiment the fourth semiconductor device 705 is designed to work in conjunction with or concurrently with the first semiconductor device 201 and/or the third semiconductor device 703.

The fourth semiconductor device 705 may be bonded to the third semiconductor device 703. In an embodiment the fourth semiconductor device 705 is only physically bonded with the third semiconductor device 703, such as by using an adhesive. In this embodiment the fourth semiconductor device 705 and the third semiconductor device 703 may be electrically connected to the third substrate 701 using, e.g., wire bonds, although any suitable electrical bonding may be utilized.

In addition, the fourth semiconductor device 705 may be bonded to the third semiconductor device 703 both physically and electrically. In this embodiment the fourth semiconductor device 705 may comprise fourth external connections (not separately illustrated in FIG. 10) that connect with fifth external connection (also not separately illustrated in FIG. 10) on the third semiconductor device 703 in order to interconnect the fourth semiconductor device 705 with the third semiconductor device 703.

The third contact pads 707 may be formed on the third substrate 701 to form electrical connections between the third semiconductor device 703 and, e.g., the fourth external connections 711. In an embodiment the third contact pads 707 may be formed over and in electrical contact with electrical routing (such as through substrate vias 715) within the third substrate 701. The third contact pads 707 may comprise aluminum, but other materials, such as copper, may be used. The third contact pads 707 may be formed using a deposition process, such as sputtering, to form a layer of material (not shown) and portions of the layer of material may then be removed through a suitable process (such as photolithographic masking and etching) to form the third contact pads 707. However, any other suitable process may be utilized to form the third contact pads 707. The third contact pads 707 may be formed to have a thickness of between about 0.5 µm and about 4 µm, such as about 1.45 µm.

The second encapsulant 709 may be used to encapsulate and protect the third semiconductor device 703, the fourth semiconductor device 705, and the third substrate 701. In an embodiment the second encapsulant 709 may be a molding compound and may be placed using a molding device (not illustrated in FIG. 10). For example, the third substrate 701, the third semiconductor device 703, and the fourth semiconductor device 705 may be placed within a cavity of the molding device, and the cavity may be hermetically sealed. The second encapsulant 709 may be placed within the cavity either before the cavity is hermetically sealed or else may be injected into the cavity through an injection port. In an embodiment the second encapsulant 709 may be a molding compound resin such as polyimide, PPS, PEEK, PES, a heat resistant crystal resin, combinations of these, or the like.

Once the second encapsulant 709 has been placed into the cavity such that the second encapsulant 709 encapsulates the region around the third substrate 701, the third semiconductor device 703, and the fourth semiconductor device 705, the second encapsulant 709 may be cured in order to harden the second encapsulant 709 for optimum protection. While the exact curing process is dependent at least in part on the particular material chosen for the second encapsulant 709, in an embodiment in which molding compound is chosen as the second encapsulant 709, the curing could occur through a process such as heating the second encapsulant 709 to between about 100° C. and about 130° C., such as about 125° C. for about 60 sec to about 3000 sec, such as about 600 sec. Additionally, initiators and/or catalysts may be included within the second encapsulant 709 to better control the curing process.

However, as one having ordinary skill in the art will recognize, the curing process described above is merely an exemplary process and is not meant to limit the current embodiments. Other curing processes, such as irradiation or even allowing the second encapsulant 709 to harden at ambient temperature, may be used. Any suitable curing process may be used, and all such processes are fully intended to be included within the scope of the embodiments discussed herein.

In an embodiment the fourth external connections 711 may be formed to provide an external connection between the third substrate 701 and, e.g., the vias 111. The fourth external connections 711 may be contact bumps such as microbumps or controlled collapse chip connection (C4) bumps and may comprise a material such as tin, or other suitable materials, such as silver or copper. In an embodiment in which the fourth external connections 711 are tin solder bumps, the fourth external connections 711 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

Once the fourth external connections 711 have been formed, the fourth external connections 711 are aligned with and placed over the vias 111, and a bonding is performed. For example, in an embodiment in which the fourth external connections 711 are solder bumps, the bonding process may comprise a reflow process whereby the temperature of the fourth external connections 711 is raised to a point where the fourth external connections 711 will liquefy and flow, thereby bonding the first package 700 to the vias 111 once the fourth external connections 711 resolidifies.

FIG. 10 also illustrates a debonding of the third external connectors 517 from the ring structure and a singulation of the structure to form a first integrated fan out package-on-package (InFO-POP) structure. In an embodiment the third external connectors 517 may be debonded from the ring structure by initially bonding the first package 700 to a second ring structure using, e.g., a second ultraviolet tape. Once bonded, the ultraviolet tape may be irradiated with ultraviolet radiation and, once the ultraviolet tape has lost its adhesiveness, the third external connectors 517 may be physically separated from the ring structure.

Once debonded, a singulation of the structure to form the first InFO-POP structure is performed. In an embodiment the singulation may be performed by using a laser or a saw blade (not shown) to slice through the encapsulant 401 and the polymer layer 105 between the vias 111, thereby separating one section from another to form the first InFO-POP structure with the second semiconductor device 301. However, as one of ordinary skill in the art will recognize, utilizing a saw blade to singulate the first InFO-POP structure is merely one illustrative embodiment and is not intended to be limiting. Alternative methods for singulating the first InFO-POP structure, such as utilizing one or more etches to separate the first InFO-POP structure, may be utilized. These methods and any other suitable methods may be utilized to singulate the first InFO-POP structure.

In another embodiment, not only is the first redistribution passivation layer 501 made of a similar material as the second redistribution passivation layer 507 (e.g., a low-temperature cured polyimide), but the first passivation layer 211 is also formed from a similar material as the second redistribution passivation layer 507. For example, in this embodiment the first passivation layer 211 (on the first semiconductor device 201) may be a low-temperature cured polyimide formed by application, exposure, development, post-development baking and curing as described above. As such, a full low temperature cured polyimide scheme is utilized within the process.

In yet another embodiment, in addition to the first passivation layer 211 and the first redistribution passivation layer 501 being a similar material, the polymer layer 105 as well is formed from a similar material as the second redistribution passivation layer 507. In this embodiment the polymer layer 105, instead of being a material such as PBO as described above, is instead a material such as the low-temperature polyimide. For example, in this embodiment the polymer layer 105 may be a low-temperature cured polyimide formed by application, exposure, development, and post-development baking as described above. However, any suitable material or method of manufacture may be utilized.

By forming all of the first passivation layer 211, the first redistribution passivation layer 501, and the polymer layer 105 to be a similar material as the rest of the front side passivation layers (e.g., the second redistribution passivation layer 507, the third redistribution passivation layer 511, and the fourth redistribution passivation layer 515), the benefits of the material (e.g., its adhesion) may be achieved on both sides of the encapsulant 401. Additionally, by forming the first redistribution passivation layer 501 as a low temperature cured polyimide material, a thermal budget for the overall manufacture may be greatly reduced. Additionally, in embodiments in which the first semiconductor device 201 is a DRAM device, which may be very susceptible to damage from heating, the DRAM/memory failure rate may be reduced from 4% (in an embodiment using a DRAM device with a high thermal budget) to as low as 0%, which may lead to a wafer per hour improvement from 10 to 16 for additional cost reductions.

In an embodiment, a method of manufacturing a semiconductor device includes placing a polymer raw material mixture over a substrate. The polymer raw material may include a polymer precursor, a photosensitizer, and an additive. The polymer raw material mixture is exposed to radiation to form a dielectric layer and cured at a temperature of between about 150° C. and about 230° C.

In another embodiment, a method of manufacturing a semiconductor device includes dispensing a mixture over a substrate. The mixture may include a polymer precursor, a photosensitizer; and an additive. The mixture may be exposed to radiation to form a passivation layer with openings. The passivation layer may be cured at a temperature of between about 170° C. and about 230° C. During the curing, the additive may act as a catalyst. A redistribution layer may then be formed over the passivation layer and in the openings.

In yet another embodiment, a method of manufacturing a semiconductor device includes attaching a die to a substrate. Vias may be formed over the substrate. Then, an encapsulant may be formed over the die and the vias. The encapsulant may contact sidewalls of the vias and sidewalls of the die. A polymer layer may be formed over the die, the vias, and the encapsulant. To form the polymer layer, a polymer raw material may be disposed over the die, the vias, and the encapsulant. The polymer raw material may include a polymer precursor, a photosensitizer, and an additive. The polymer raw material may be patterned to form a polymer material. The patterning may involve exposing the polymer raw material to radiation. The polymer material may then be cured at a temperature of less than 230° C. The curing may form above about 98% cyclization in the polymer layer. A redistribution layer may then be formed over the polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    placing a polymer raw material over a substrate, the polymer raw material comprising:
        a polymer precursor;
        a photosensitizer; and
        an additive, the additive being a polyether;
    exposing the polymer raw material to radiation to form a dielectric layer; and
    curing the dielectric layer at a temperature, the additive acting as a catalyst during the curing.

2. The method according to claim 1, wherein curing the dielectric layer is at a temperature between about 170° C. and less than 200° C.

3. The method according to claim 1, wherein curing the dielectric layer is at a temperature less than about 170° C.

4. The method according to claim 1, wherein the curing the dielectric layer occurs at a temperature of between about 170° C. and 230° C.

5. The method according to claim 1, wherein the additive increases a free volume of the polymer raw material.

6. The method according to claim 1, wherein the curing the dielectric layer forms above about 98% cyclization in the dielectric layer.

7. The method according to claim 1, wherein the polymer precursor has a concentration of between about 25% and about 35%, wherein the photosensitizer has a concentration of between about 1% and about 8%, and wherein the additive has a concentration between about 1% and 10%.

8. The method according to claim 7, wherein the additive has a concentration of about 5%.

9. The method according to claim 7, wherein the additive has a concentration of about 3%.

10. A method of manufacturing a semiconductor device, the method comprising:
    dispensing a mixture over a substrate, the mixture comprising:
        a polymer precursor;
        a photosensitizer; and
        an additive, the additive being selected from the group consisting essentially of polyethylene glycol and polypropylene glycol;
    exposing the mixture to radiation to form a passivation layer with openings;
    curing the passivation layer at a temperature of between about 170° C. and about 230° C., the additive acting as a catalyst during the curing; and
    forming a redistribution layer over the passivation layer and in the openings.

11. The method according to claim 10, wherein the additive comprises polypropylene glycol (PPG).

12. The method according to claim 10, wherein the additive comprises an ester.

13. The method according to claim 10, wherein the additive comprises an alcohol.

14. The method according to claim 10, wherein the additive comprises polyethylene glycol (PEG).

15. The method according to claim 14, wherein the PEG has a molecular weight of about 600.

16. A method of manufacturing a semiconductor device, the method comprising:
    attaching a die to a substrate;
    forming vias over the substrate;
    forming an encapsulant over the die and the vias, the encapsulant contacting sidewalls of the vias and sidewalls of the die;
    forming a polymer layer over the die, the vias, and the encapsulant, comprising:
        disposing a polymer raw material over the die, the vias, and the encapsulant, the polymer raw material comprising a polymer precursor, a photosensitizer, and an additive;
        patterning the polymer raw material to form a polymer material, the patterning comprising exposing the polymer raw material to radiation; and
        curing the polymer material at a temperature of less than 230° C., the curing forming above about 98% cyclization in the polymer layer; and
    after forming the polymer layer, forming a redistribution layer over the polymer layer.

17. The method according to claim 16, wherein the curing forms about 100% cyclization in the polymer layer.

18. The method according to claim 16, wherein after curing, the polymer layer comprises the additive.

19. The method according to claim 16, wherein the polymer precursor comprises a polyamic acid ester.

20. The method according to claim 19, wherein the polymer layer has a Young's Modulus of more than about 3.4 GPa.

\* \* \* \* \*